(12) United States Patent
Haider et al.

(10) Patent No.: US 7,332,425 B2
(45) Date of Patent: Feb. 19, 2008

(54) SIMULTANEOUS DEPOSITION AND ETCH PROCESS FOR BARRIER LAYER FORMATION IN MICROELECTRONIC DEVICE INTERCONNECTS

(75) Inventors: Asad M. Haider, Plano, TX (US); Alfred J. Griffin, Jr., Dallas, TX (US); Kelly J. Taylor, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 11/126,460

(22) Filed: May 11, 2005

(65) Prior Publication Data

US 2006/0258142 A1   Nov. 16, 2006

(51) Int. Cl.
*H01L 21/4763* (2006.01)

(52) U.S. Cl. ............... 438/618; 438/197; 438/680; 438/905; 257/E21.017; 257/E21.304; 257/E21.421; 257/E21.435

(58) Field of Classification Search ............... 438/618, 438/197, 637, 700, 723, 743, 756, 680, 692, 438/766, 768, 769, 905
See application file for complete search history.

(56) References Cited

U.S. PATENT DOCUMENTS

| | | | | |
|---|---|---|---|---|
| 5,869,395 | A | * | 2/1999 | Yim ..................... 438/637 |
| 5,968,847 | A | * | 10/1999 | Ye et al. ................. 438/734 |
| 6,340,435 | B1 | * | 1/2002 | Bjorkman et al. ........... 216/72 |
| 6,364,995 | B1 | * | 4/2002 | Fairbairn et al. ....... 156/345.1 |
| 6,547,978 | B2 | * | 4/2003 | Ye et al. .................. 216/75 |
| 6,669,858 | B2 | * | 12/2003 | Bjorkman et al. ........... 216/72 |
| 6,875,699 | B1 | * | 4/2005 | Lassig et al. ............. 438/706 |

OTHER PUBLICATIONS

U.S. Appl. No. 11/126,413, filed May 11, 2005, Haider.

* cited by examiner

*Primary Examiner*—David Nhu
(74) *Attorney, Agent, or Firm*—Wade James Brady, III; Frederick J. Telecky, Jr.

(57) ABSTRACT

The present invention provides a method of forming a interconnect barrier layer 100. In the method, physical vapor deposition of barrier material 200 is performed within an opening 140 located in a dielectric layer 135 of a substrate 110. RF plasma etching of the barrier material 200 that is deposited in the opening 140 occurs simultaneously with conducting the physical vapor deposition of the barrier material 200.

18 Claims, 6 Drawing Sheets

SIMULTANEOUS DEPOSITION AND ETCH PROCESS FOR BARRIER LAYER FORMATION IN MICROELECTRONIC DEVICE INTERCONNECTS

TECHNICAL FIELD OF THE INVENTION

The present invention is directed, in general, to a method for manufacturing integrated circuits and more specifically, to a method of manufacturing an interconnect barrier layer for the integrated circuit.

BACKGROUND OF THE INVENTION

The push toward smaller and faster semiconductor devices has resulted in a shift towards the use of copper for making electrical interconnections in integrated circuits. For instance, copper offers a number of benefits over aluminum: higher electrical conductivity, good resistance to electromigration, and reduced cross talk and propagation delays at higher interconnect densities. Copper interconnects are not without difficulties, however. For instance, copper atoms readily diffuse into silicon-containing dielectric layers, with resultant degradation in the performance of active devices in the integrated circuit. It is therefore necessary to dispose a barrier layer between a copper interconnect and the dielectric layer to decrease the diffusion of copper into the dielectric layer.

The requirement for a diffusion barrier layer when using copper-containing interconnects introduces another problem. Because the barrier layer occupies a portion of the space in the interconnect, the thickness of the copper layer deposited over the barrier layer in the interconnect is reduced. A thinner copper layer results in an increase in the resistance across the interconnect, which in turn, results in slower active devices. It is desirable therefore to make thin uniform diffusion barrier layers. The need for a thin uniform barrier becomes increasingly important for each reduction in each technology node size.

It has proven difficult, however, using conventional methods to produce barrier layers that uniformly and conformally coat the interconnect. Consequently, when filled with copper, there are regions of sidewall where the thickness of copper is small because of a thicker barrier layer thereunder, thereby increasing resistance and slowing the active device. In addition, the performance of active devices containing such an interconnect may be compromised because copper atoms can diffuse into the dielectric layer through portions of the sidewall that are not coated with, or have areas with too thin a barrier layer. Moreover, because the uniformity of the barrier layer can vary widely from center to edge of a wafer, the device performance of similar devices built on different areas of the same wafer can vary considerably from each other.

Accordingly, what is needed in the art is a method and system for manufacturing copper interconnects having uniformly conformal, thin, and continuous interconnect barrier layers, while avoiding the above-discussed disadvantages associated with conventional methods and systems for forming barrier layers.

SUMMARY OF THE INVENTION

To address the above-discussed deficiencies of the prior art, the present invention provides in one embodiment, a method of forming an interconnect barrier layer. The method comprises physical vapor deposition of barrier material within an opening located in a dielectric layer of a substrate. The method also comprises a radiofrequency (RF) plasma etch of the barrier material deposited in the opening simultaneously with conducting the physical vapor deposition of the barrier material.

The method of manufacturing comprises forming a microelectronic device on a substrate and forming a dielectric layer over the microelectronic device. The method also comprises forming an interconnect barrier layer in an opening in the dielectric layer by the above-described simultaneous physical vapor deposition of barrier material within an opening located in the dielectric layer of a substrate and the RF plasma etch of the barrier material deposited in the opening.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

As part of the present invention it was determined that conventional physical vapor deposition methods for forming barrier layers are problematic because they deposit the barrier material in a directional manner. The directional deposition causes the excessive formation of barrier material at the bottom as compared to the sidewalls of the interconnect. Moreover, the directional deposition of barrier material causes non-uniform barrier layer thicknesses on the sidewalls. The directional deposition can also cause the barrier material to accumulate at the top of the interconnect creating an overhang. Overhanging barrier material further restricts the formation of a barrier layer to a greater degree on sidewalls than on the bottom of the interconnect. The overhanging barrier material also prevents complete filling of the interconnect with metal. These problems are exacerbated for interconnects located at the perimeter of wafers because the extent of directional deposition of barrier material is greater at the perimeter than at the center of the wafer.

It was also determined that conventional attempts to remedy the non-uniform barrier layer by re-sputtering the barrier layer are inadequate. The term re-sputter refers to the application of a separate RF plasma etch step after a physical vapor deposition step. Re-sputtering decreases the non-uniformity of the barrier layer by redistributing barrier material from the bottom to the sidewalls of the interconnect. Unfortunately, for interconnects with smaller widths, and hence thinner barrier layer thicknesses, re-sputtering cannot be adequately controlled to form a uniform barrier layer. For instance, re-sputtering often entirely removes barrier material from the bottom of the interconnect. As a result, an additional barrier deposition step is required to deposit new barrier material at the bottom of the interconnect. The additional barrier deposition steps can exacerbate the extent of overhanging material at the top of the interconnect. Moreover, the total throughput of wafers that can be fabricated in a deposition tool is decreased because of the time required for re-sputtering step and the additional deposition step.

The present invention recognizes, for the first time, the advantages of combining physical vapor deposition and RF plasma etching into a single step, where both of these operations are performed simultaneously. While not limiting the scope of the invention by theory, it is believed that physical barrier deposition in the presence of a magnetic field generated in the vicinity of the interconnect as part of the RF plasma etch helps disperse the atoms being deposited. This in turn makes the barrier material deposition substantially omni-directional. Consequently, the uniformity of the barrier layer in the interconnect is greatly improved. The total throughput of wafers in the deposition tool is also improved because the time spent on separate deposition, re-sputtering and repeat deposition steps can be greatly reduced or eliminated entirely.

Figure 1:
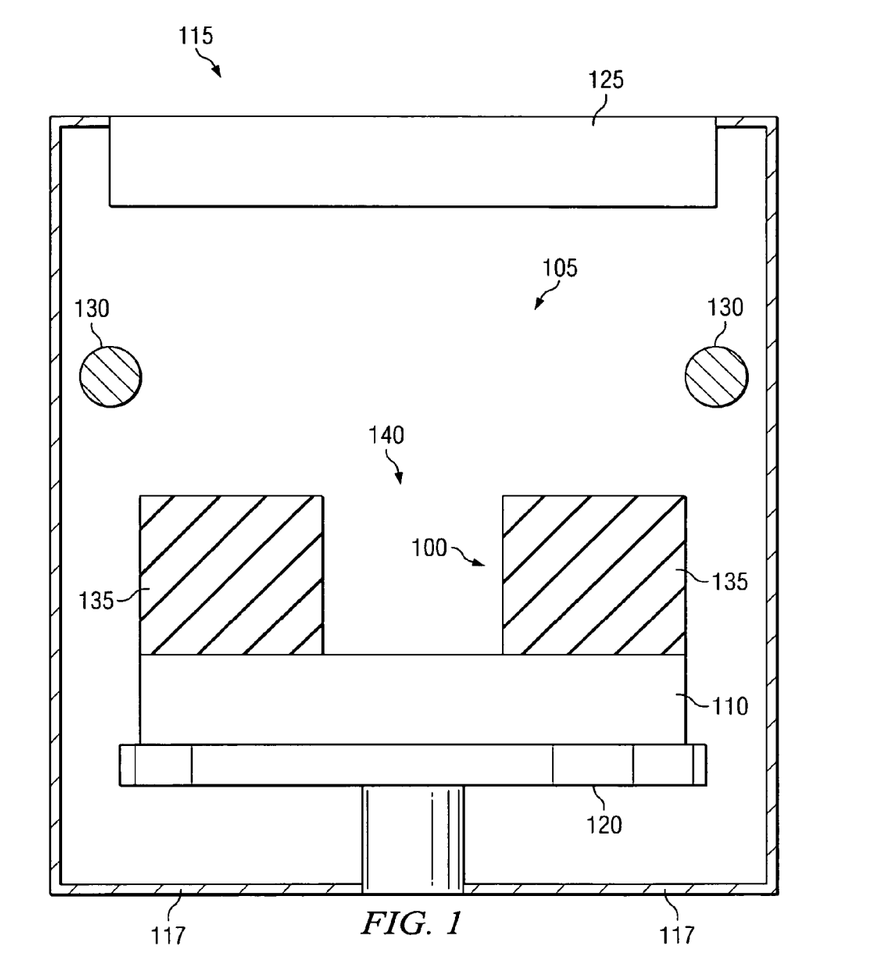
FIGS. 1 to 3 illustrate cross-sectional views of selected steps in an exemplary method of forming an interconnect barrier layer according to the principles of the present invention.
Figure 2:
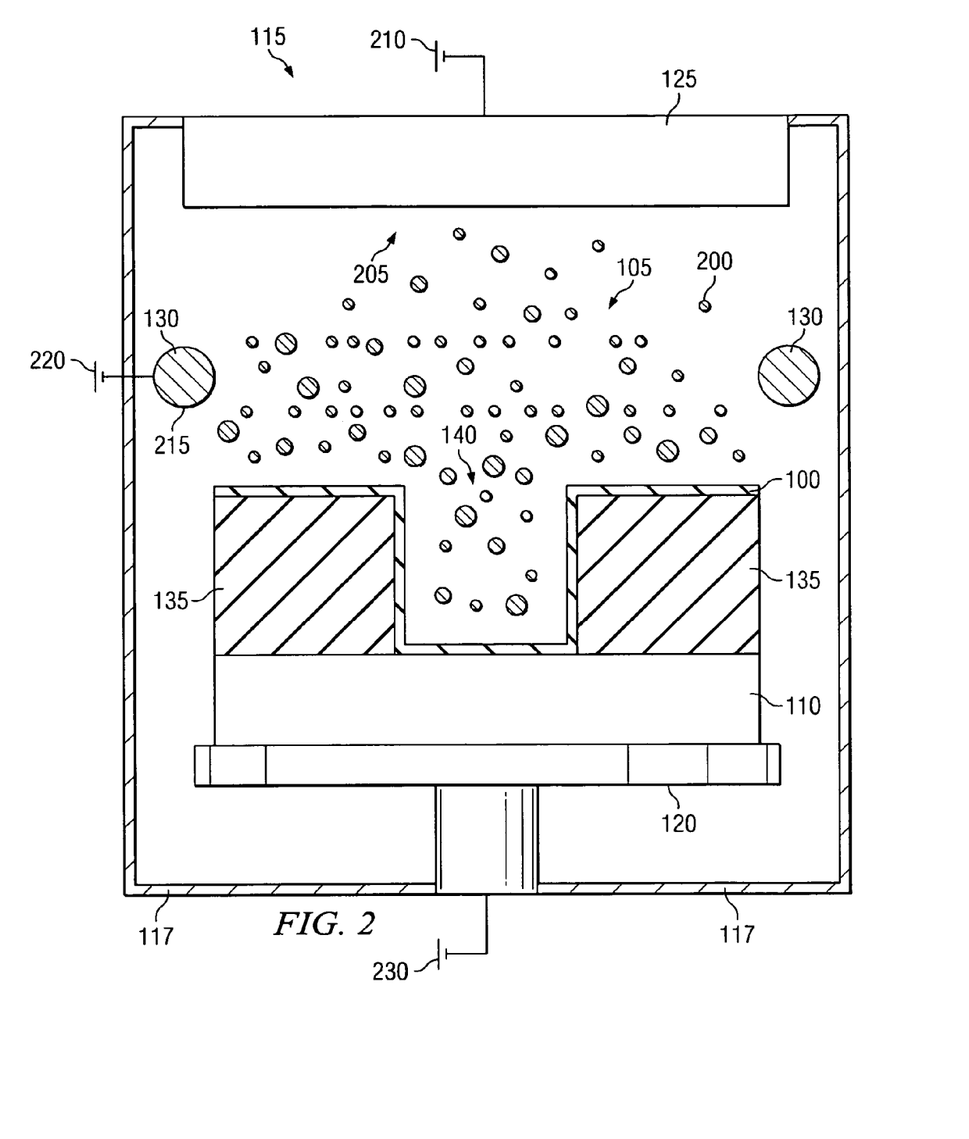
Figure 3:
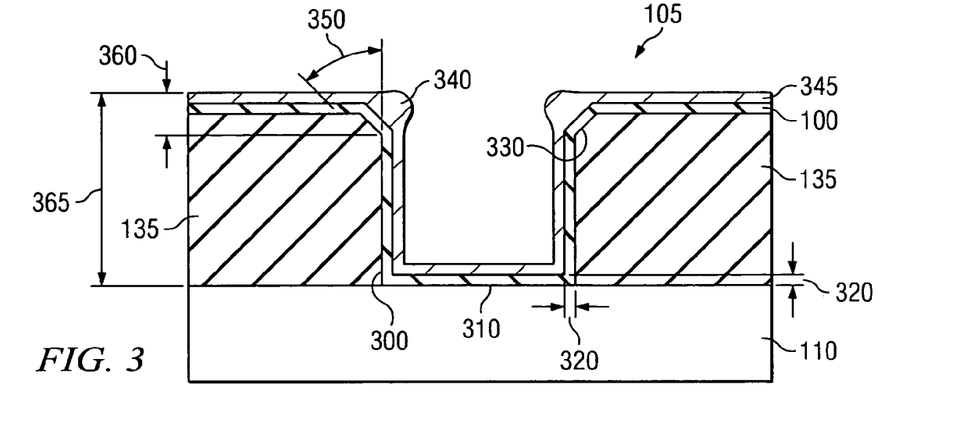

One embodiment of the present invention is a method of forming an interconnect barrier layer. FIG. 1 to 3 illustrate cross-sectional views of selected steps of an exemplary method of forming an interconnect barrier layer 100. Turning first to FIG. 1, illustrated is the partially completed barrier layer 100 for an interconnect 105 after placing a substrate 110 in a deposition tool 115, such as a physical vapor deposition tool. The deposition tool 115 comprises conventional components to facilitate barrier layer 100 deposition. For instance, as illustrated in FIG. 1, the deposition tool 115 can have a chamber 117 that comprises a pedestal 120 configured to hold the substrate 110, a target 125 and a RF coil 130.

The substrate 110 comprises any conventional material used in microelectronic device fabrication. In certain preferred embodiments, the substrate 110 is a silicon wafer. The substrate 110 can include other conventional materials, such as oxide and metal layers, used in the manufacture of active or passive devices.

The substrate 110 depicted in FIG. 1 has a dielectric layer 135 with an opening 140 formed therein. In some embodiments the dielectric layer 135 is an interlayer or intra-metal dielectric layer in an integrated circuit. In some preferred embodiments the dielectric layer 135 comprises silicon carbide, organo-silicate glass (OSG), tetraethyl orthosilicate (TEOS) or combinations thereof, including multi-layered combinations. The opening 140 can be formed using any conventional process for forming vias, trenches or lines in microelectronic devices, including single or dual damascene integration schemes.

With continuing reference to FIG. 1, FIG. 2 illustrates the partially completed interconnect barrier layer 100 while simultaneously physical vapor depositing barrier material 200 within the opening 140 and RF plasma etching the barrier material 200 deposited in the opening 140. In cases where the opening 140 is filled with copper, the barrier material 200 and subsequently formed barrier layer 100 preferably comprise Tantalum, Tantalum Nitride or a combination thereof. In other embodiments the barrier layer 100 and barrier material 200 comprise any conventional metals used to form a diffusion barrier, including titanium, tantalum, zirconium, ruthenium, iridium, iridium oxide, platinum, or combinations thereof.

Physical vapor deposition preferably comprises sputtering, although other methods of physical vapor deposition such as evaporation are also within the scope of the present invention. In some instances, physical vapor deposition comprises impacting the target 125 comprised of barrier material 200 with ions 205, such as positively charged argon ions. In some cases, physical vapor deposition further comprises applying a direct current 210 to the target 125 to negatively bias the target 125 and thereby attract the ions 205 to the target 125. In some preferred embodiments, the direct current 210 applied to the target 125 has a power ranging from about 10 to about 30 kilowatts. In still other embodiments where it is desirable to form a barrier layer 100 comprising a metal nitride, such as tantalum nitride, nitrogen gas is introduced into the chamber 117 of the deposition tool 115 where the physical vapor deposition is performed.

Radiofrequency plasma etching is produced by applying an alternating current (AC) 220 to the RF coil 130. In some preferred embodiments of the method of forming the barrier layer 100, the AC 220 is applied to the RF coil 130 at a power ranging from about 400 to about 1200 Watts. In some preferred embodiments, the AC 220 is applied at a frequency of about 14 Megahertz.

It is advantageous for both the direct current 210 and the AC 220 to be applied at a constant power within their respective ranges during the simultaneous deposition and etch step. Holding these power settings at a constant value improves the uniformity of barrier layer 100 formation both within different areas of the same substrate 110 as well as between different substrates 110. For instance, it is preferable for the power settings associated with the direct current 210 and the AC 220 to vary by less than about ±1 percent throughout the entire simultaneous physical vapor deposition and RF plasma etch step.

As illustrated in FIGS. 1 and 2, the coil 130 used for RF plasma etching can be located inside the chamber 117 of the deposition tool 115. In other embodiments, however, the RF coil 130 is located outside of the chamber 117. In cases where the RF coil 130 is inside of the chamber 117, it is preferable that the surface 215 of the RF coil 130 be composed substantially of the barrier material 200. A surface 215 made of barrier material 200 is preferred because this eliminates the potential for undesired non-barrier material from being deposited from the RF coil 130 into the opening 140, and thereby changing the composition and properties of the barrier layer 100.

In yet other embodiments of the method, an AC positive voltage bias 230 is applied to the substrate 110. As well known to those skilled in the art, the rate and directionality of barrier atom 260 physical vapor deposition can be decreased by applying a positive bias to the substrate 110.

Similarly, the rate of RF plasma etching is affected by the AC positive voltage bias 230. The AC positive voltage bias 230 is preferably applied during, and more preferably throughout, the simultaneous physical vapor deposition and RF plasma etch step.

In preferred embodiments, as illustrated in FIG. 2, the AC positive voltage bias 230 is indirectly applied to the substrate 110, for example, through the pedestal or chuck 120 that the substrate 110 is located on. Applying the AC positive voltage bias 230 directly to the substrate 110 is also within the scope of the present invention. In some preferred embodiments, the AC positive voltage bias 230 applied to the substrate 110 is applied at a power ranging from about 300 to about 900 Watts. More preferably, the AC positive voltage bias 230 is applied at a constant power (e.g., ±1 percent) for the desired setting within this range throughout the entire simultaneous deposition and etching process.

The conditions for depositing and etching during the simultaneous process must be carefully adjusted and controlled so that these two processes cooperate to form the desired uniform barrier layer 100. For instance, in some cases it is advantageous for the deposition tool 115 to be configured to provide rates of barrier atom 200 deposition and etching that can range from about 2 to about 25 Angstroms per second. Configuring the deposition tool 115 in this manner is facilitated by calibrating the tool 115 for its separate rates of deposition and etching over a range of process parameters and for the barrier atom 200 of interest on blank (i.e., unpatterned) wafers. One of ordinary skill in the art would be familiar with the type and range of process parameters that are important for different barrier materials and how these would depend on the particular type of deposition tool 115 being used. Non-limiting examples of such process parameters include the above-mentioned direct current 210 to the target 125, AC 220 power to the RF coil 130 and AC positive voltage bias 230 to the substrate 110, as well as other tool settings such as the pressure of the chamber 117 or the energy of the ions 205.

During the simultaneous deposition and etch process, the process parameters of the deposition tool 115 are adjusted to provide the desired rates of deposition and etching based on the above-mentioned tool calibrations. For instance, the expected rates of deposition and etching are adjusted so that there is a net deposition of barrier material in the opening 140. This is achieved by providing a rate of deposition that is greater than the rate of etching during the simultaneous deposition and etching process. In some preferred embodiments, the simultaneous physical vapor depositing and RF plasma etching corresponds to a ratio of rates of physical vapor depositing to RF plasma etching that ranges from greater than about 1:1 to about 15:1, and even more preferably about 5:1.

These principles are illustrated in the following example. For the purposes of illustration, the deposition tool's 115 calibrated rate of tantalum physical vapor deposition on a blank wafer is about 20 Angstroms per second when applying 20 kilowatts of direct current 210 to the target 125 and 475 Watts of AC positive voltage bias 230 to the blank wafer. The deposition tool's 115 calibrated rate of RF plasma etching of a tantalum layer on a blank wafer equals about 10 Angstroms per second when the AC 220 is applied at a power of 800 Watts to the RF coil 130. If the simultaneous deposition and etching process were performed under the above-described conditions, the ratio of rates of physical vapor depositing to RF plasma etching would be about 2:1.

One advantage realized with the simultaneous physical vapor deposition and RF plasma etch process is that the rate of deposition of barrier material 200 is more finely controlled than possible by physical vapor deposition alone. This is especially important when depositing a thin barrier layer 100, e.g., a barrier layer 100 thickness of less than about 20 nm and more preferably less than about 10 nm. For instance, certain commercial physical vapor deposition tools are not designed to deposit or re-sputter such thin barrier layers. Therefore, even with physical vapor deposition or re-sputter times as short as a few seconds, too much barrier material 200 can get deposited or removed, respectively, making it problematic to consistently produce thin uniform barrier layers 100 throughout an interconnect 105 and across the substrate 110, and also from substrate wafer to substrate wafer. In contrast, the simultaneous deposition and etching process of the present invention slows the net deposition of barrier material 200. This, in turn, allows better control of the rate of barrier layer 100 formation. Moreover, the rate of barrier layer 100 formation can be finely controlled by adjusting the ratio of the rates of physical vapor deposition to RF plasma etching.

With continuing reference to FIGS. 1 and 2, FIG. 3 illustrates the barrier layer 100 after completing the simultaneous physical vapor deposition and RF plasma etch step and removing the substrate 110 from the deposition tool 115. FIG. 3 illustrates another advantage associated with the method: the formation of a conformal barrier layer 100 with a high degree of uniformity. As an example, the barrier layer 100 on the sidewalls 300 and bottom 310 of the interconnect 105 can have a thickness variation of less than about ±10 percent relative to a thickness 320 of the barrier layer 100. Moreover, these small thickness variations are achieved for barrier layer thickness 320 of about 10 nm or less.

FIG. 3 illustrates still another advantage associated with the simultaneous physical vapor deposition and RF plasma etch process: the formation of an interconnect 105 with a beveled opening 330. A beveled opening 330 is advantageous in instances where the production of an overhang 340 during the interconnect 105 formation process remains problematic. The simultaneous deposition and etch step of the present invention substantially reduces the presence of an overhang made of barrier material. Nevertheless, there can still be an overhang 340 formed during subsequent steps such as during a conventional physical vapor deposition of a metal seed layer 345. The presence of a beveled opening 330 helps prevent the interconnect 105 from being restricted or entirely closed by the overhang 340. Conventional methods typically require a separate step, such as argon sputtering, or re-sputtering to form a beveled opening. The present invention eliminates the need to perform these additional steps because the beveled opening 330 is formed during the simultaneous deposition and etch step.

The top angle 350 of the beveled opening 330 is controlled by adjusting the ratio of the rate of physical vapor deposition to the rate of RF plasma etching during the simultaneous deposition and etch step. The higher the ratio, the smaller the top angle 350 of the beveled opening 330. Too large a top angle 350 is undesirable because this increases the risk that the interconnect 105 could interfere with other features on the substrate 110. Too small a top angle 350, however, does not mitigate the above-discussed detrimental effects of overhang 340 formation. A ratio of the rates of physical vapor deposition and RF plasma etching in the range from greater than 1:1 to 15:1 produces a top angle 350 ranging from about 20 to about 70 degrees, respectively. Preferably, the height 360 of the beveled opening 330 comprises less than about an upper 10 percent of the height 365 of the interconnect 105.

Figure 4:
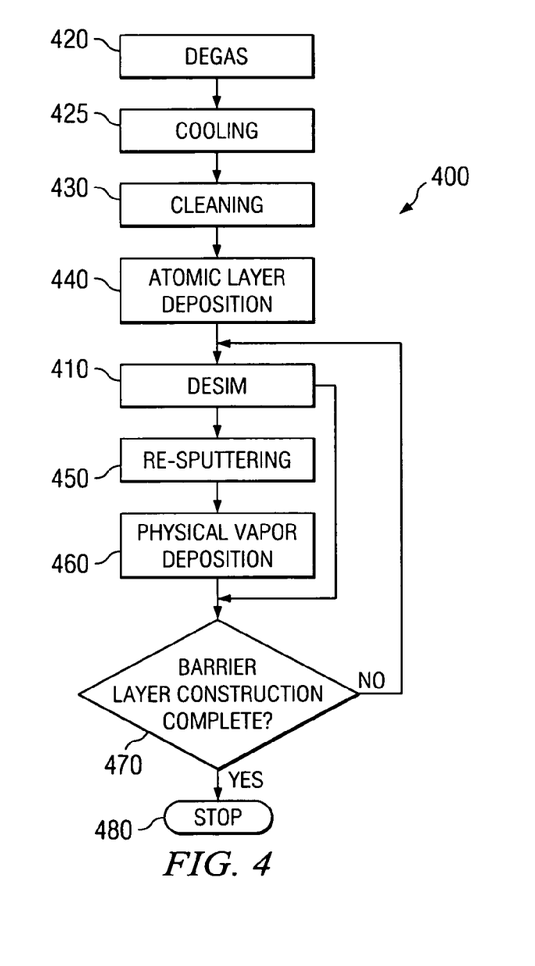
FIG. 4 presents by flow diagram, an exemplary method of forming an interconnect barrier layer following the principles of the present invention.

The above-described method of forming an interconnect barrier layer can be integrated with a number of additional steps to facilitate barrier layer formation. This is illustrated in FIG. 4, which presents by flow diagram, an exemplary method 400 of forming an interconnect barrier layer. As shown in FIG. 4, the method 400 comprises a step 410 of simultaneous physical vapor deposition of barrier material and a RF plasma etch (DESIM). The DESIM step 410 can include any of the embodiments discussed above in the context of FIGS. 1-3.

Some preferred embodiments of the method 400 also comprise a degassing step 420. In some embodiments degassing 420 comprises heating a substrate wafer from about 200 to about 350° C. for about 1 to 3 minutes. Degassing 420 advantageously removes any volatile components such as organic material or water, off of the substrate surface. In some instances, it is advantageous for the degassing step 420 to be followed by a cooling step 425. In some cases cooling comprises reducing the substrate's temperature to about 20° C.

Other advantageous embodiments of the method 400 further comprise, a cleaning step 430. The cleaning step 430 advantageously removes any foreign material not removed by degassing. In some preferred embodiments cleaning 430 comprises a plasma sputter etch using argon as the sputtering source. In other cases cleaning 430 comprises a reactive plasma etch using a mixture of hydrogen and helium.

Certain embodiments of the method 400 include a step 440 of atomic layer deposition of barrier material. In some cases it is advantageous for the atomic layer deposition (ALD) step 440 to be performed before the DESIM step 410. ALD can advantageously form a very thin conformal barrier layer (e.g., about 2.5 nm thick) in the interconnect. Moreover ALD is especially good at forming such thin barrier layers comprising metal nitride. Any conventional materials and instrumentation can be used to facilitate ALD of the barrier material. In some preferred embodiments, where the atomic layer deposited barrier layer comprises tantalum nitride, the organo-metallic precursor comprises pentakis (dimethylamide)tantalum. It is still desirable to perform the DESIM step 410 following the ALD step 440. The barrier layer deposited by the DESIM step 410 provides a superior barrier layer surface for metal seed layer deposition than the barrier layer deposited by the ALD step 440.

Other embodiments of the method 400 include a re-sputtering step 450, in which a separate RF plasma etch is performed. Any of the conditions used for the RF plasma etch component of the DESIM step 410 can also be used for the separate RF plasma etch. In some cases the separate RF etch comprises applying a second AC at a second power to the same RF coil as used for the DESIM step 410, in an absence of physical vapor deposition of barrier material. As noted above, re-sputtering advantageously removes excessive amounts of barrier material from the bottom of the interconnect and redistributes the barrier material to the side walls. In some preferred embodiments the re-sputtering step 450 is performed immediately after the DESIM step 410. This is advantageous when the DESIM step 410 has produced a barrier layer with a higher than desired thickness of barrier material at the bottom of the interconnect.

Still other embodiments of the method include a separate physical vapor deposition step 460 of barrier material. Any of the conditions used for the physical vapor deposition component of the DESIM step 410 can also be used for the separate physical vapor deposition. A separate physical vapor deposition step 460 is especially beneficial where one or both of the DESIM step 410 or re-sputtering step 450 have produced a barrier layer with insufficient thickness at the bottom of the interconnect. In some preferred embodiments, the physical vapor deposition step 460 is performed after the re-sputtering step 450 to deposit barrier material onto the bottom of the interconnect. In other cases it is advantageous to perform the physical vapor deposition step 460 after the DESIM step 410. This is advantageous when the DESIM step 410 has produced barrier layer with a lower than desired thickness of barrier material at the bottom of the interconnect. Another advantage of the separate physical vapor deposition step 460 is to provide some barrier material at the bottom of the interconnect after a barrier re-sputter process in case the interconnect is misaligned with respect to the underlying metal layer.

At step 470 it is decided whether or not barrier layer formation is completed. For instance, the decision can be based on whether or not certain performance criterion such as barrier layer thickness and uniformity or beveled opening production were met for test interconnects manufactured using the same sequence of fabrication steps. In cases where further processing is desired, in some embodiments of the method, one or both of the re-sputtering and physical vapor depositions steps 450, 460 are performed alternately with the DESIM step 410 in an iterative fashion for a plurality of times before stopping the process at step 480. One skilled in the art would understand how to balance the inclusion and repetition of the optional steps 420 to 470 to produce a more uniform barrier layer verses reducing the deposition tool's throughput due to the extra time required to perform these additional steps.

Figure 5:
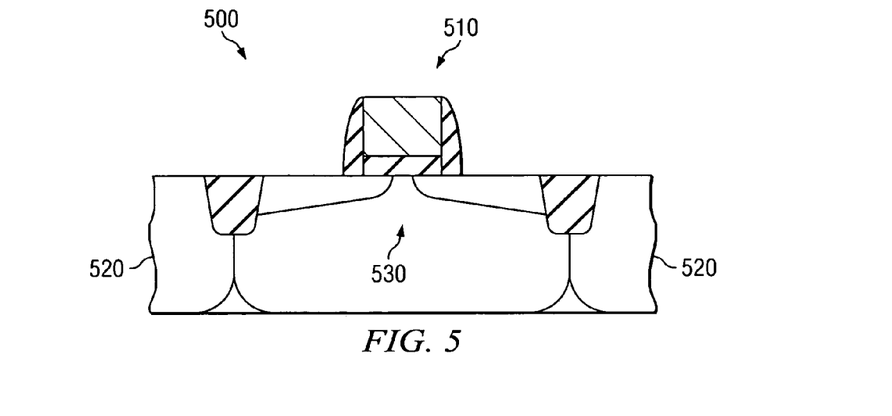
FIGS. 5 to 10 illustrate cross-sectional views of an exemplary method of manufacturing an integrated circuit according to the principles of the present invention.

Another aspect of the present invention is a method of manufacturing an integrated circuit. FIGS. 5-10 illustrate cross-sectional views of selected steps in an exemplary method of manufacturing an integrated circuit 500 according to the principles of the present invention. Turning first to FIG. 5, illustrated is the partially completed integrated circuit 500 after forming a microelectronic device 510 on a substrate 520. The microelectronic device 510 can comprise an NMOS transistor 530. Embodiments of the microelectronic device 510 can further comprise pMOS transistor, CMOS, BiCMOS devices, bipolar or other types of active or passive integrated circuit components, and combinations thereof.

Figure 6:
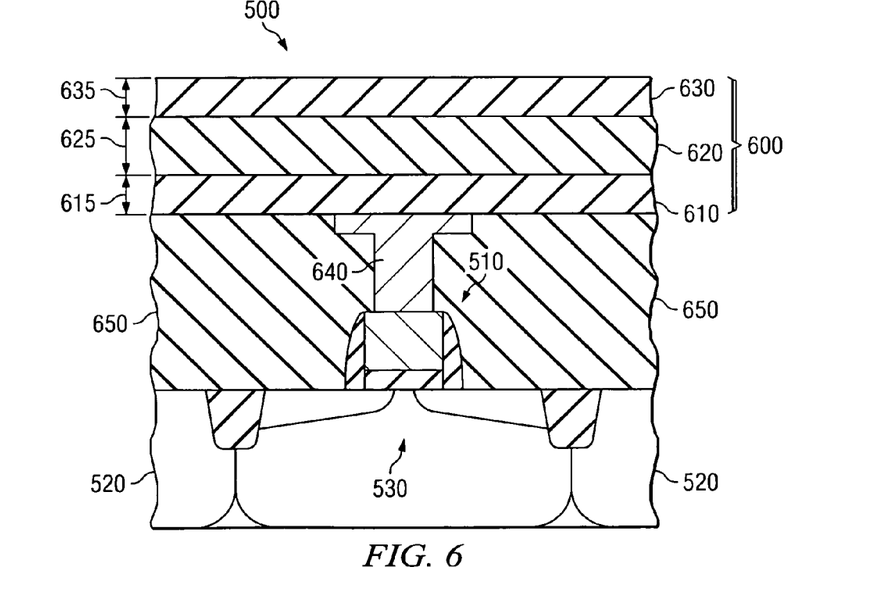

FIG. 6 illustrates the partially completed integrated circuit 500 after forming a dielectric layer 600 over the microelectronic device 510. The dielectric layer 600 can comprise any conventional material, such as silicon dioxide. The dielectric layer 600 is formed using conventional techniques, such as such as Plasma Enhanced Chemical Vapor Deposition of silicon dioxide to a desired thickness under conditions well known to those of ordinary skill in the art. For the particular embodiment shown in FIG. 6, the dielectric layer 600 comprises a silicon carbonitride layer 610 having a thickness 615 of about 60 nm, an OSG layer 620 having a thickness 625 of about 260 nm, and TEOS cap layer 630 having a thickness 635 of about 180 nm. For the embodiment illustrated in FIG. 6, the dielectric layer 600 is an interlayer dielectric layer formed over a conventionally formed metal line 640 in a second dielectric layer 650 over the microelectronic device 510.

Figure 7:
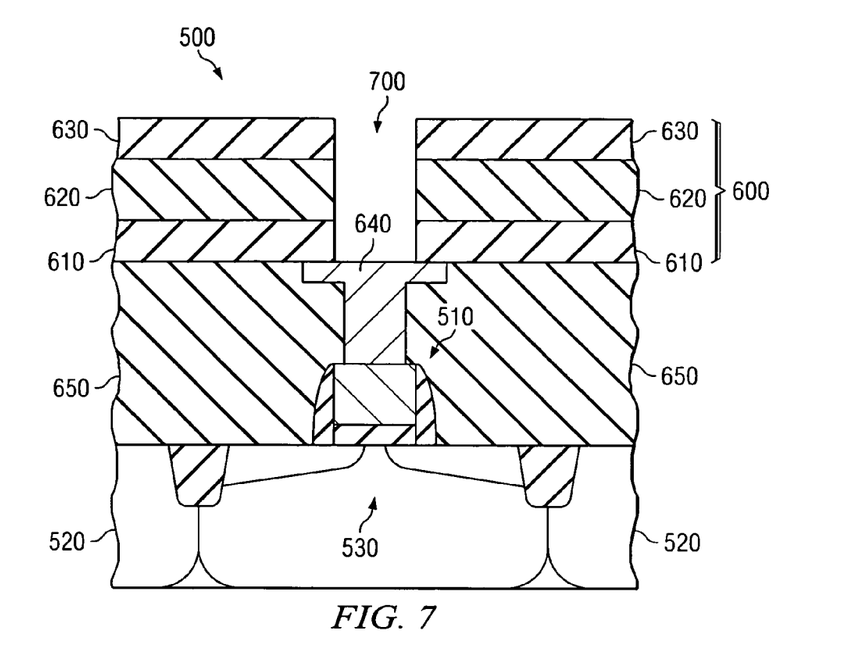

FIG. 7 illustrates the partially completed integrated circuit 500 after forming an opening 700 in the dielectric layer 600. Those of ordinary skill in the art would be familiar with the variety of conventional photolithography and etching processes that can be used to form the opening 700. For the embodiment presented in FIG. 7 the opening 700 is formed over the metal line 640.

Figure 8:
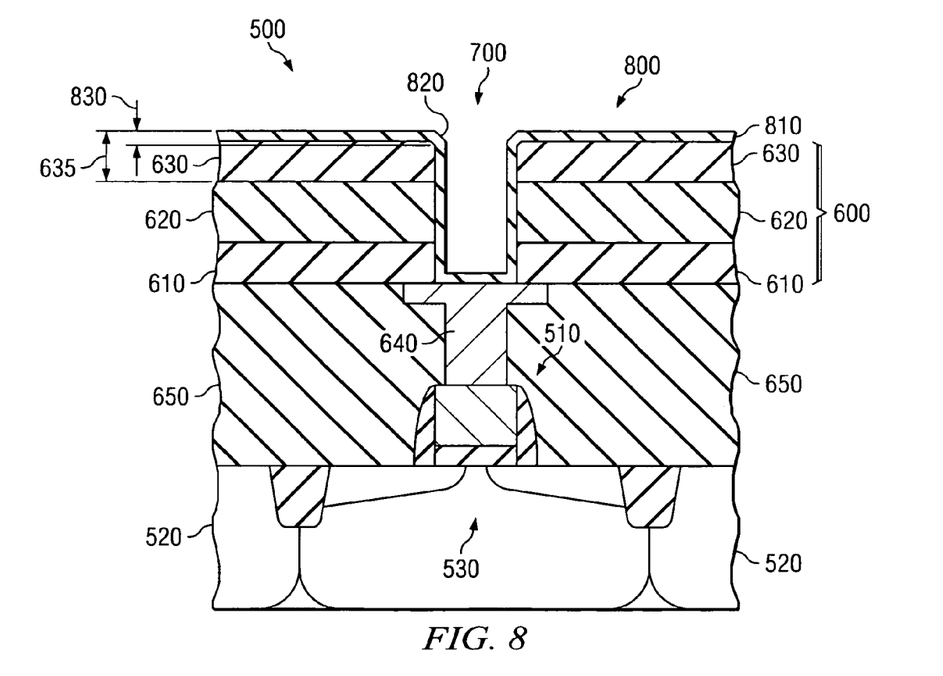
Figure 9:
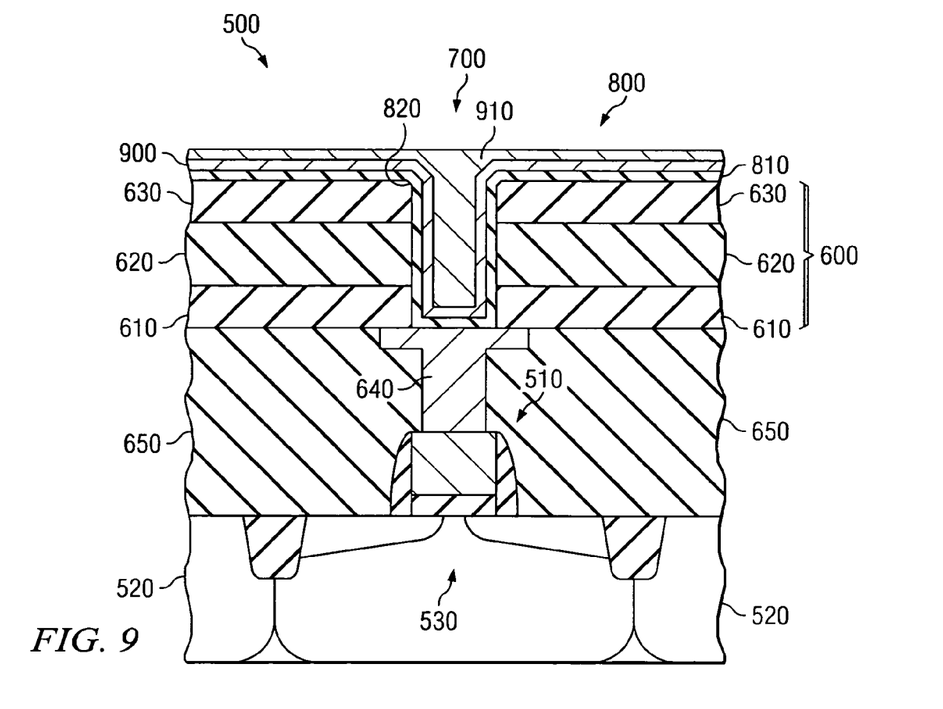

FIG. 8-9 illustrate selected stages in forming an interconnect 800 in the opening 700 in the dielectric layer 600. Turning to FIG. 8, illustrated is the partially completed integrated circuit 500 after forming a barrier layer 810 in the interconnect 800. Barrier layer 810 formation can comprise any embodiments of the above-described simultaneous process of physical vapor deposition of barrier material within the opening 700 and RF plasma etching of the barrier material deposited in the opening 700. Of course, any of the above-described conventional steps for forming a barrier layer, discussed in the context of FIG. 4, can also be integrated into the method of manufacturing the integrated circuit 500. As further illustrated in FIG. 8 in some cases, the interconnect 800 comprises a beveled opening 820. In some preferred embodiments, the height 830 of the beveled opening 820 extends to the top half to one-fifth of the thickness 635 of the TEOS cap layer 630.

FIG. 9. illustrates the partially completed integrated circuit 500 after forming a metal seed layer 900 over the barrier layer 810 and filling the interconnect 800 with a metal fill layer 910. In some preferred embodiments both the metal seed layer 900 and metal fill layer 910 comprise copper. The metal seed layer 900 is preferably deposited in the opening 700 by a vacuum process, such as chemical vapor deposition and more preferably, physical vapor deposition. The metal fill layer 910 is preferably deposited by a wet process, such as electrochemical deposition or electroless chemical deposition.

Figure 10:
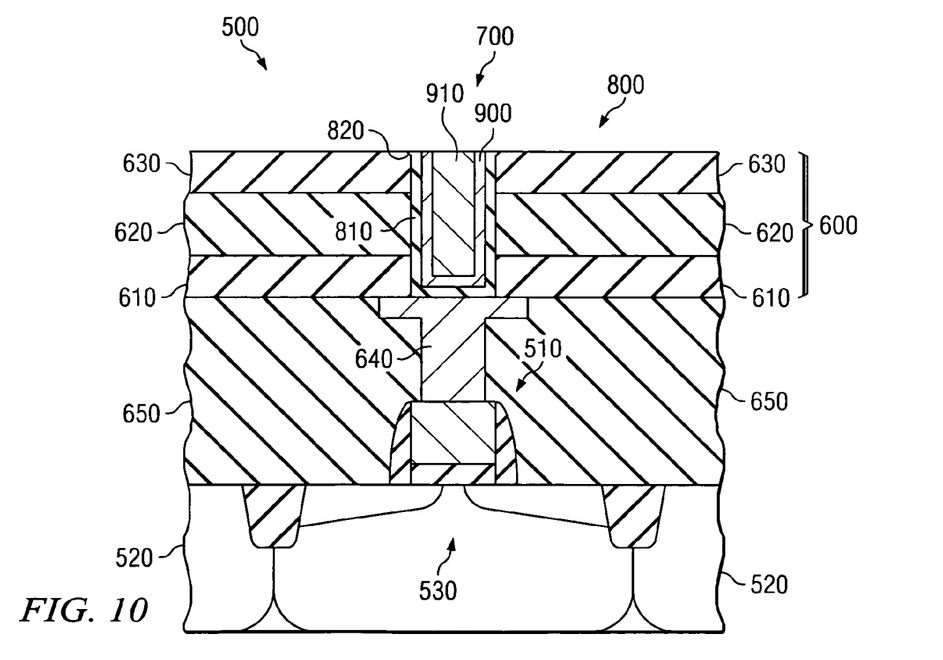

FIG. 10 shows the partially completed integrated circuit 500 after planarizing the substrate 520 to remove portions of the barrier layer 800, metal seed layer 900 and metal fill layer 910 lying outside the opening 700. Planarizing can be achieved by any conventional process such as chemical mechanical polishing.

One of ordinary skill would understand that the method of manufacturing the integrated circuit 500 depicted in FIGS. 5-10 can be extended to form additional interconnects over the microelectronic device 510 and would understand how to connect those interconnects with the microelectronic device 510 to form an operative integrated circuit 500.

Although the present invention has been described in detail, those skilled in the art should understand that they can make various changes, substitutions and alterations herein without departing from the scope of the invention in its broadest form.

What is claimed is:

1. A method of forming an interconnect barrier layer comprising:
   physical vapor deposition of barrier material within an opening located in a dielectric layer of a substrate; and
   a radiofrequency (RF) plasma etch of said barrier material deposited in said opening simultaneously with conducting said physical vapor deposition of said barrier material wherein said simultaneous physical vapor deposition and RF plasma etch corresponds to a ratio of rates of physical vapor deposition to RF plasma etching ranging from greater than about 1:1 to about 15:1.

2. The method as recited in claim 1, wherein an element of said barrier material are selected from the group consisting of:
   Titanium;
   Tantalum;
   Zirconium;
   Ruthenium;
   Iridium;
   Iridium Oxide;
   Platinum; and
   combinations thereof.

3. The method as recited in claim 1, wherein said barrier material comprises Tantalum, Tantalum Nitride or a combination thereof.

4. The method as recited in claim 1, wherein said RF plasma etch comprises applying an alternating current (AC) to a RF coil.

5. The method as recited in claim 4, wherein said AC is applied to said coil at a power ranging from about 400 to about 1200 Watts.

6. The method as recited in claim 4, wherein a surface of said coil comprises said barrier material.

7. The method as recited in claim 1, wherein said physical vapor deposition comprises applying a direct current to a target at a power ranging from about 10 to about 30 kilowatts.

8. The method as recited in claim 1, wherein said simultaneous physical vapor deposition and RF plasma etch comprises applying an AC positive voltage bias to said substrate at a power ranging from about 300 to about 900 Watts.

9. The method as recited in claim 1, wherein said simultaneous physical vapor deposition and RF plasma etch forms an interconnect with a beveled opening having a top angle of about 20 to about 70 degrees.

10. The method as recited in claim 1, wherein a height of said beveled opening comprises less than an about upper 10 percent of a height of said dielectric layer.

11. The method as recited in claim 1, wherein said simultaneous physical vapor deposition and RF plasma etch forms an interconnect having a conformal barrier layer with a thickness variation of less than about ±10 percent relative to a thickness of said conformal barrier layer.

12. A method of manufacturing an integrated circuit comprising:
   forming a microelectronic device on a substrate;
   forming a dielectric layer over said microelectronic device;
   forming an interconnect barrier layer in an opening in said dielectric layer comprising:
      physical vapor deposition of barrier material within an opening located in a dielectric layer of a substrate; and
      a radiofrequency (RF) plasma etch of said barrier material deposited in said opening simultaneously with conducting said physical vapor deposition of said barrier material wherein said simultaneous physical vapor deposition and RF plasma etch corresponds to a ratio of rates of physical vapor deposition to RF plasma etching ranging from greater than about 1:1 to about 15:1.

13. The method as recited in claim 12, further comprises a separate re-sputtering and separate physical vapor deposition step.

14. The method as recited in claim 13, wherein said separate re-sputtering step comprises applying a second AC to a RF coil in an absence of said separate physical vapor deposition of said barrier material.

15. The method as recited in claim 13, wherein said separate re-sputtering step and said separate physical vapor deposition step are performed iteratively with said simultaneous physical vapor deposition and RF plasma etch.

16. The method as recited in claim 12, further comprises degassing said substrate before said simultaneous physical vapor deposition and RF plasma etch.

17. The method as recited in claim 12, further comprises degassing, cooling and cleaning said substrate before said simultaneous physical vapor deposition and RF plasma etch.

18. The method as recited in claim 12, further comprises a separate atomic layer deposition of said barrier material before said simultaneous physical vapor deposition and RF plasma etch.

* * * * *